(12) United States Patent
Smirnov et al.

(10) Patent No.: US 7,511,798 B2
(45) Date of Patent: Mar. 31, 2009

(54) OFF-AXIS CATADIOPTRIC PROJECTION OPTICAL SYSTEM FOR LITHOGRAPHY

(75) Inventors: Stanislav Smirnov, Bethel, CT (US); Mark Oskotsky, Mamaroneck, NY (US)

(73) Assignee: ASML Holding N.V., Veldhoven (NL)

( * ) Notice: Subject to any disclaimer, the term of this patent is extended or adjusted under 35 U.S.C. 154(b) by 63 days.

(21) Appl. No.: 10/902,469

(22) Filed: Jul. 30, 2004
(Under 37 CFR 1.47)

(65) Prior Publication Data

US 2006/0023191 A1 Feb. 2, 2006

(51) Int. Cl.
*G03B 27/42* (2006.01)
*G03B 27/70* (2006.01)

(52) U.S. Cl. .................................. 355/66; 355/53
(58) Field of Classification Search ................ 355/43, 355/45, 51, 53, 57, 60, 66, 67, 77
See application file for complete search history.

(56) References Cited

U.S. PATENT DOCUMENTS

| | | | | |
|---|---|---|---|---|
| 4,953,960 | A | 9/1990 | Williamson | 350/442 |
| 5,229,872 | A | 7/1993 | Mumola | 359/40 |
| 5,296,891 | A | 3/1994 | Vogt et al. | 355/67 |
| 5,440,423 | A * | 8/1995 | Ogura | 359/365 |
| 5,477,057 | A | 12/1995 | Angeley et al. | 250/548 |
| 5,523,193 | A | 6/1996 | Nelson | 430/311 |
| 6,473,243 | B1 | 10/2002 | Omura | 359/730 |
| 6,486,940 | B1 | 11/2002 | Williamson | 355/67 |
| 6,636,350 | B2 * | 10/2003 | Shafer et al. | 359/366 |
| 6,665,126 | B2 | 12/2003 | Shafer et al. | 359/649 |
| 6,700,644 | B2 * | 3/2004 | Sweatt | 355/53 |
| 6,829,099 | B2 | 12/2004 | Kato et al. | |
| 6,947,124 | B2 * | 9/2005 | Antoni et al. | 355/67 |
| 7,158,215 | B2 * | 1/2007 | Harned et al. | 355/66 |
| 2002/0136351 | A1 | 9/2002 | Singer | 378/34 |
| 2003/0223125 | A1 | 12/2003 | Sewell et al. | 359/726 |
| 2004/0004771 | A1 | 1/2004 | Omura | 359/649 |
| 2004/0027653 | A1 * | 2/2004 | Shafer et al. | 359/366 |
| 2004/0070743 | A1 * | 4/2004 | Hudyma et al. | 355/67 |
| 2004/0160666 | A1 * | 8/2004 | Hudyma | 359/359 |
| 2004/0246595 | A1 * | 12/2004 | Beach | 359/728 |
| 2005/0036213 | A1 * | 2/2005 | Mann et al. | 359/726 |
| 2005/0088640 | A1 * | 4/2005 | Eib et al. | 355/77 |
| 2005/0190435 | A1 * | 9/2005 | Shafer et al. | 359/365 |
| 2006/0012885 | A1 * | 1/2006 | Beder et al. | 359/649 |

FOREIGN PATENT DOCUMENTS

EP 0 803 755 A2 10/1997

(Continued)

*Primary Examiner*—Rodney E Fuller
(74) *Attorney, Agent, or Firm*—Sterne, Kessler, Goldstein & Fox P.L.L.C.

(57) ABSTRACT

An off-axis catadioptric projection optical systems for use in lithography tools for processing modulated light used to form an image on a substrate is provided. In one embodiment the optical system includes an off-axis mirror segment, a fold mirror, a relay, an aperture stop and a refractive lens group. Modulated light is transmitted through the system to form an image on a substrate. In a second embodiment the projection system includes an off-axis mirror segment, an aperture stop and a refractive lens group. In a third embodiment the projection system includes an off-axis mirror segment, a negative refractive lens group, a concave mirror, a relay, an aperture stop, and a refractive lens group. A method to produce a device using a lithographic apparatus including a projection system with an off-axis mirror segment as the first element in a projection optics system is also provided.

6 Claims, 5 Drawing Sheets

FOREIGN PATENT DOCUMENTS

| | | |
|---|---|---|
| JP | 2001-343589 A | 12/2001 |
| JP | 2004-514943 A | 5/2004 |
| WO | WO 98/33096 | 7/1998 |
| WO | WO 98/38597 | 9/1998 |
| WO | WO 01/50171 A1 | 7/2001 |
| WO | WO 02/44786 A2 | 6/2002 |

* cited by examiner

OFF-AXIS CATADIOPTRIC PROJECTION OPTICAL SYSTEM FOR LITHOGRAPHY

BACKGROUND OF THE INVENTION

1. Field of the Invention

The present invention relates to lithography, and more particularly, to projection optics used in lithography.

2. Background of Invention

Lithography systems are used to print features in a variety of manufacturing applications. Photolithography systems use a mask or reticle to expose features onto an object. In semiconductor manufacturing, for example, a reticle is exposed by an exposure beam. An optical system then projects a reduced image of the reticle onto a silicon wafer. In this way, circuit features can be printed on a semiconductor substrate.

Maskless lithography systems have been developed that do not require use of a mask or reticle. Current maskless lithography systems project a pattern to be printed onto a moving object. For example, a pattern of circuit features can be projected onto a moving wafer or flat panel display. In one example, a silicon wafer can be coated with a photoresist. The pattern is projected on the wafer using one or more pattern generating devices, such as spatial light modulator (SLM) arrays. This SLM array is a programmable array of elements that modulates the light projected onto the object. Types of SLMs can include, for example, digital micromirror devices (DMD), transmissive liquid crystal light valves (LCLV), and grating light valves (GLV).

Projection optical systems are used to transmit light generated by a pattern generator, such as an SLM or a static light source used in lithography systems that use masks, to a wafer to create an image on the wafer. Existing projection systems have significant limitations. Among these limitations are that existing systems often include a very large number of optical components and are often complicated. For example, in one case the projection optical system includes three relays. The first relay is an on-axis module, while the other two are off-axis modules. Each module must be corrected independently. Aberrations of on-axis and off-axis modules are not compensable. Furthermore, the alignment process is complicated and overall dimensions are large. Other limitations are found in systems that limit light transmission to only about 25% of the light provided by the pattern generating device.

What is needed is a projection system that provides high performance with reduced complexity.

SUMMARY OF THE INVENTION

The present invention is directed to off-axis catadioptric projection systems for use in lithography tools, such as a lithographic projection apparatus, for processing modulated light used to form an image on a substrate, such as a semiconductor wafer. A catadioptric system is one in which both reflective and refractive optical elements are used. A number of embodiments are disclosed. In one embodiment the projection system includes a pattern generator, an off-axis mirror segment, a relay, an aperture stop and a refractive lens group. Modulated light is transmitted through the system to form an image on a substrate. A primary advantage of this embodiment is that the off-axis mirror segment can be used to reduce field curvature.

In a second embodiment the projection system includes a pattern generator, an off-axis mirror segment, a fold mirror, a relay, an aperture stop and a refractive lens group. Like the first embodiment, this embodiment reduces field curvature of the modulated light, and provides greater design flexibility compared to the first embodiment.

In a third embodiment the projection system includes a pattern generator, an off-axis mirror segment, a negative refractive lens group, a concave mirror, a relay, an aperture stop and a refractive lens group. This embodiment also reduces field curvature of the modulated light. The use of the concave mirror allows further reduction of field curvature. Additionally, the use of the negative refractive lens group reduces chromatic aberrations, and allows the relay and refractive lens group designs to be simplified.

A method to produce a device using a lithographic apparatus including a projection system with an off-axis mirror segment as the first element in a projection optics system is also provided.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1:
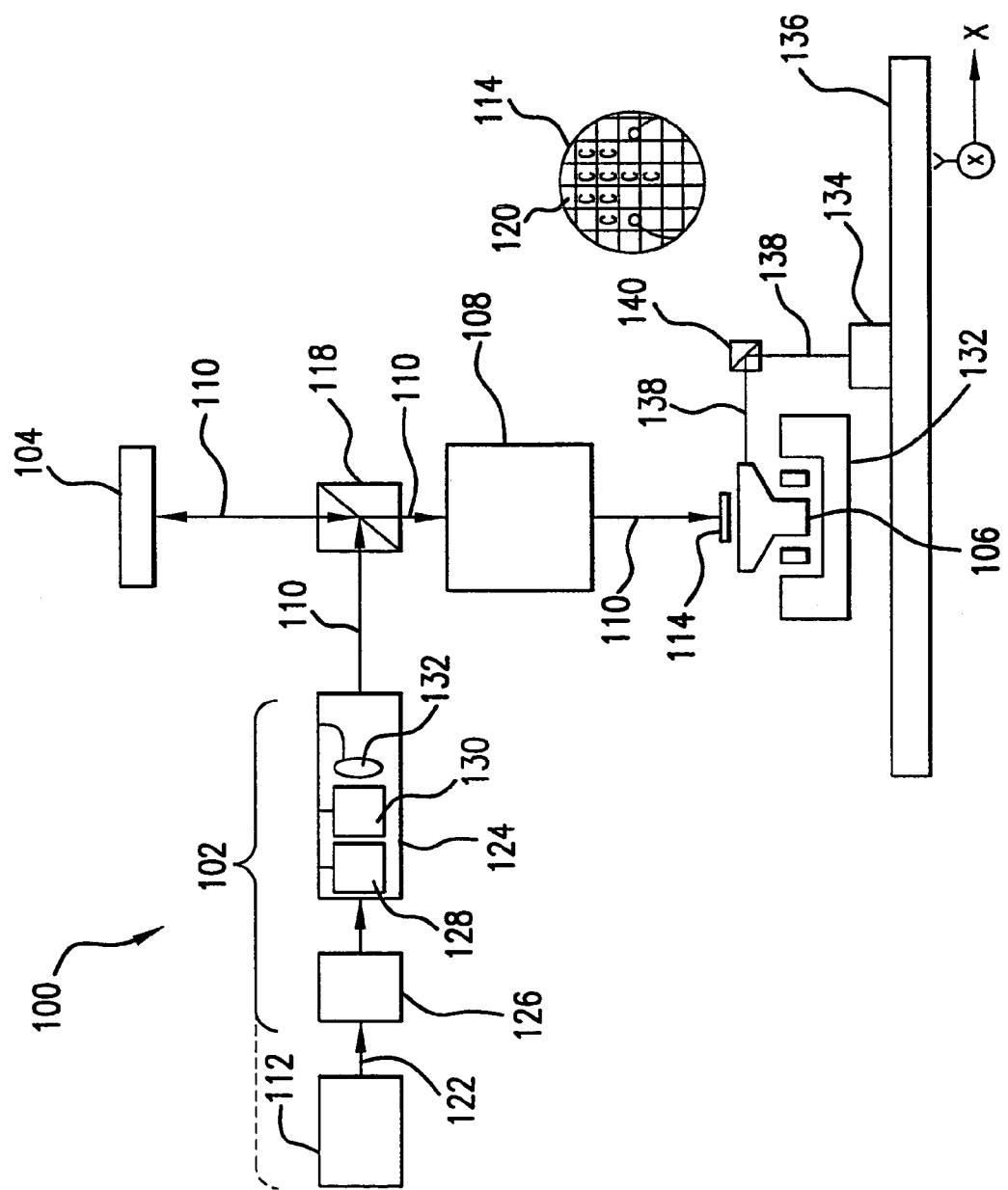
FIG. 1 is a diagram of a lithographic projection apparatus, according to an embodiment of the invention.

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

The term "pattern generator" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the pattern generator can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the pattern generator may differ substantially from the pattern eventually transferred to a layer of or on the substrate. Similarly, the pattern eventually generated on the substrate may not correspond to the pattern formed at any one instant on the pattern generator. This may be the case in an arrangement in which the eventual pattern formed on each part of the substrate is built up over a given period of time or a given number of exposures during which the pattern on the pattern generator and/or the relative position of the substrate changes.

Although specific reference may be made in this text to the use of lithographic apparatus in the manufacture of ICs, it should be understood that the lithographic apparatus and projection systems described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" and "light ray" used herein encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 5-20 nm), as well as particle beams, such as ion beams or electron beams.

The illumination system may also encompass various types of optical components, including refractive, reflective, and catadioptric optical components for directing, shaping, or controlling the projection beam of radiation.

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 is a diagram of lithographic projection apparatus 100, according to an embodiment of the invention. Apparatus 100 includes at least a radiation system 102, pattern generator 104, an object table 106 (e.g., a substrate table), and an projection system 108.

Radiation system 102 can be used for supplying a projection beam 110 of radiation (e.g., UV radiation), which in this particular case also comprises a radiation source 112.

An pattern generator 104 (e.g., spatial light modulator) can be used for applying a pattern to projection beam 110. In general, the position of pattern generator 104 can be fixed relative to projection system 108. However, in an alternative arrangement, pattern generator 104 may be connected to a positioning device (not shown) for accurately positioning it with respect to projection system 108. As here depicted, pattern generator 104 is of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device (not shown) for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of pattern generator 104 onto substrate 114. Alternatively, projection system 108 may project images of secondary sources for which the elements of pattern generator 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on pattern generator 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts pattern generator 104 after being directed using beam splitter 118. Having been reflected by pattern generator 104, beam 110 passes through projection system 108, which focuses beam 110 onto a target portion 120 of the substrate 114.

With the aid of positioning device (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the pattern generator 104 can be used to accurately correct the position of pattern generator 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position pattern generator 104. It will be appreciated that projection beam 110 may alternatively/additionally be moveable, while object table 106 and/or pattern generator 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern from pattern generator 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, pattern generator 104 is movable in a given direction (the so-called "scan direction", e.g., the y direction) with a speed v, so that patterned projection beam 110 is caused to scan over pattern generator 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on pattern generator 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on pattern generator 104 is updated as patterned projection beam 110 scans across substrate 114 and exposes it.

Combinations and/or variations on the above described modes of use or entirely different modes of use may also be employed.

Figure 2:
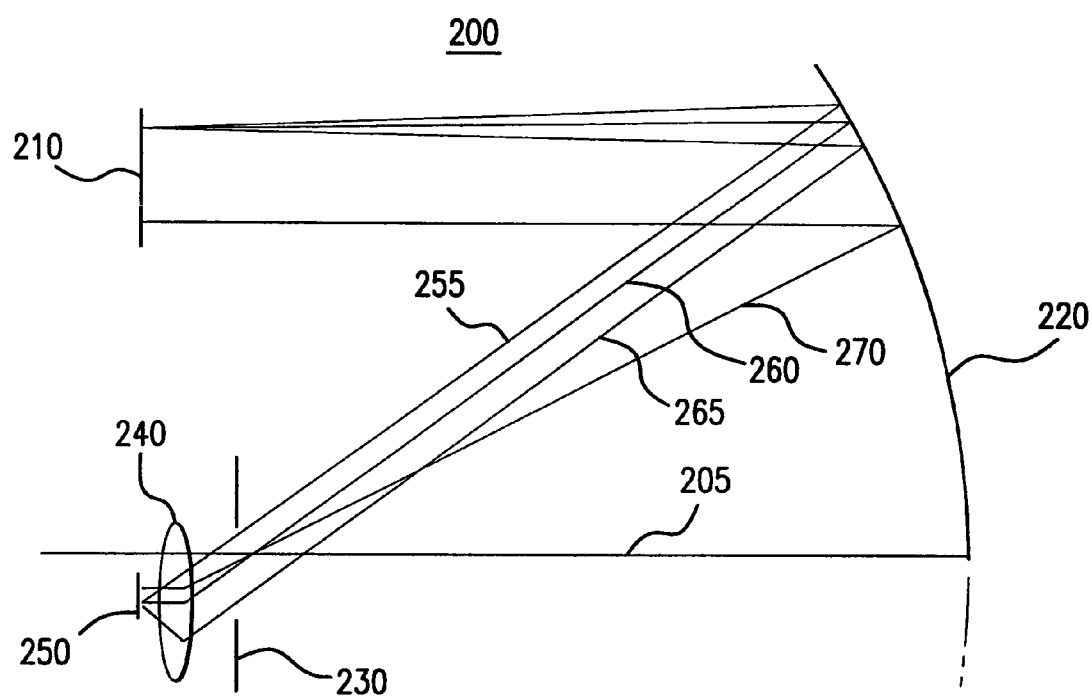
FIG. 2 is a diagram of a projection system with an off-axis mirror segment for use in a lithography tool, according to an embodiment of the present invention.

FIG. 2 is a diagram of projection system 200 with an off-axis mirror segment for use in a lithography tool, such as lithographic projection apparatus 200, according to an embodiment of the invention. Projection system 200 includes pattern generator 210, off-axis mirror segment 220, aperture stop 230, and refractive lens group 240.

Pattern generator 210 modulates light for use in forming an image on a wafer or other substrate. Pattern generator 210 can be a spatial light modulator (SLM), but is not limited to an SLM. Light rays, such as rays 255, 260, 265 and 270 are transmitted from pattern generator 210 to off-axis mirror segment 220. Rays 255 and 265 are marginal rays, while rays 260 and 270 are chief rays. Line 205 represents the optical axis of optical system 200.

Off-axis mirror segment 220 receives light rays and reflects those light rays. Off-axis mirror segment 220 can be concave, which is conducive for field curvature correction. Light rays 255, 260, 265 and 270 are reflected from off-axis mirror segment 220 through aperture stop 230. Upon passing through aperture stop 230, light rays 255, 260, 265 and 270 impinge upon lens 240. Upon receiving light rays, refractive lens group 240 provides the main optical power of optical system 200 and focuses the light rays onto substrate 250 to form an image on substrate 250. Refractive lens group 240 can be a single refractive element or a set of refractive elements. Aperture stop 230 should be placed at front focal point of refractive lens group 240. Substrate 250 is positioned at the image plane of the whole optical system including off-axis mirror segment 220 and refractive lens group 240.

Figure 3:
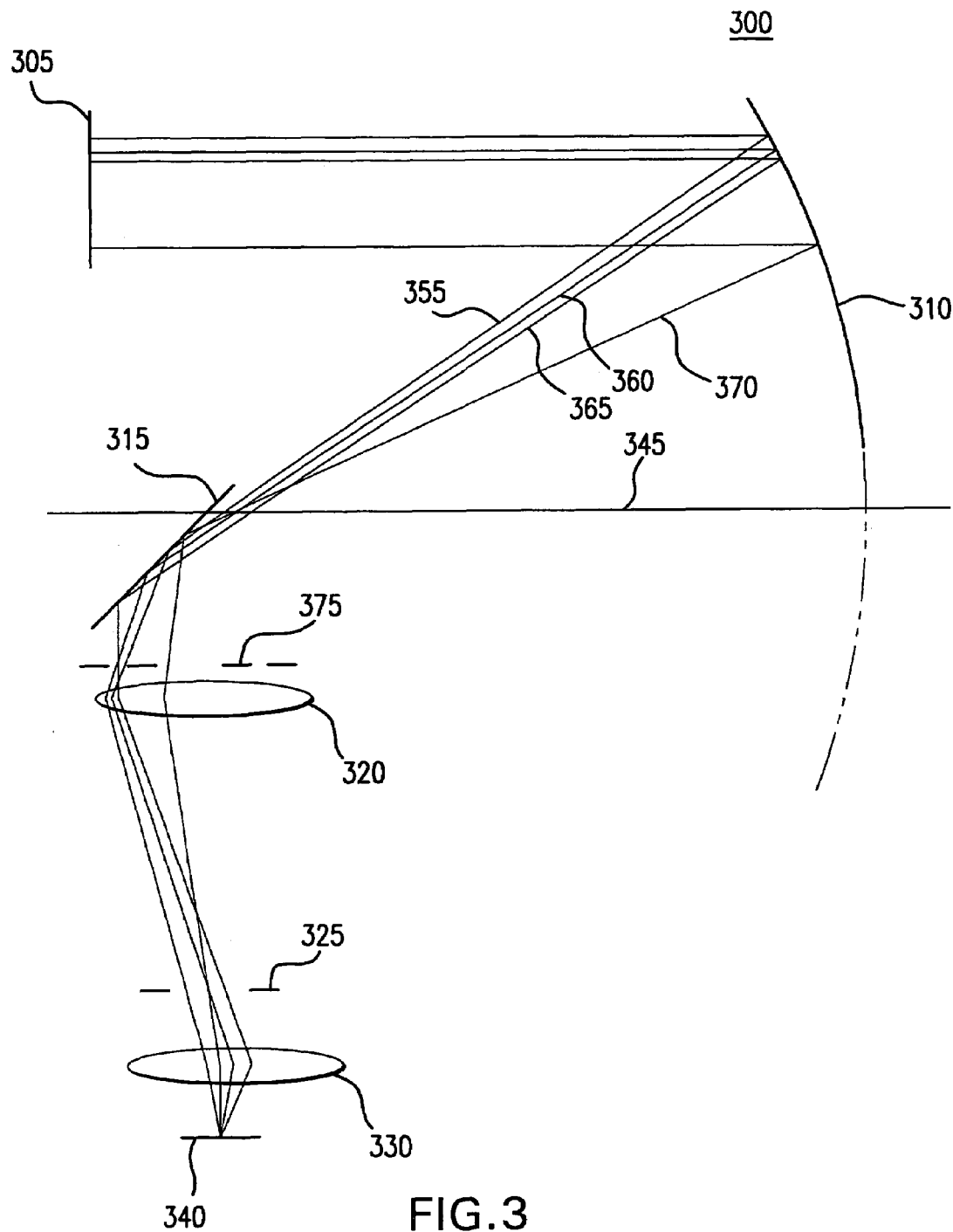
FIG. 3 is a diagram of a projection system with an off-axis mirror segment for use in a lithography tool, according to an embodiment of the present invention.

FIG. 3 is a diagram of projection system 300 with an off-axis mirror segment for use in a lithography tool, such as lithographic projection apparatus 100, according to an embodiment of the present invention. Projection system 300 provides similar functionality to projection system 200, but allows for greater flexibility in the placement of a wafer or substrate to be imaged.

Projection system 300 includes pattern generator 305, off-axis mirror segment 310, fold mirror 315, relay 320, aperture stop 325, and refractive lens group 330. Pattern generator 305 modulates light for use in forming an image on a wafer or other substrate. Pattern generator 305 can be a spatial light modulator (SLM), but is not limited to an SLM. Light rays, such as rays 355, 360, 365 and 370 are transmitted from pattern generator 305 to off-axis mirror segment 310. Rays 355 and 365 are marginal rays, while rays 360 and 370 are chief rays. Line 345 represents the optical axis of optical system 300.

Off-axis mirror segment 310 receives light rays and reflects those light rays. Off-axis mirror segment 310 can be concave, which is conducive for field curvature correction. Light rays 355, 360, 365 and 370 are reflected from off-axis mirror segment 310 to fold mirror 315. Fold mirror 315 reflects the light rays toward relay 320. The use of fold mirror 315 enables greater flexibility in the placement of wafer 340, than was the case in projection system 200. An intermediate image 375 is formed that occurs prior to relay 320.

Relay 320 includes a set of refractive lens and mirrors as will be known by individuals skilled in the relevant arts. Relay 320 provides optical power for projection system 300 and passes the light rays through aperture stop 325. Upon passing through aperture stop 325, light rays 355, 360, 365 and 370 impinge upon refractive lens group 330. Upon receiving light rays, refractive lens group 330 provides additional optical power for projection system 300 and focuses the light rays onto substrate 340 to form an image on substrate 340. Refractive lens group 330 can be a single refractive element or a set of refractive elements. Aperture stop 325 should be placed at front focal point of refractive lens group 330.

Figure 4:
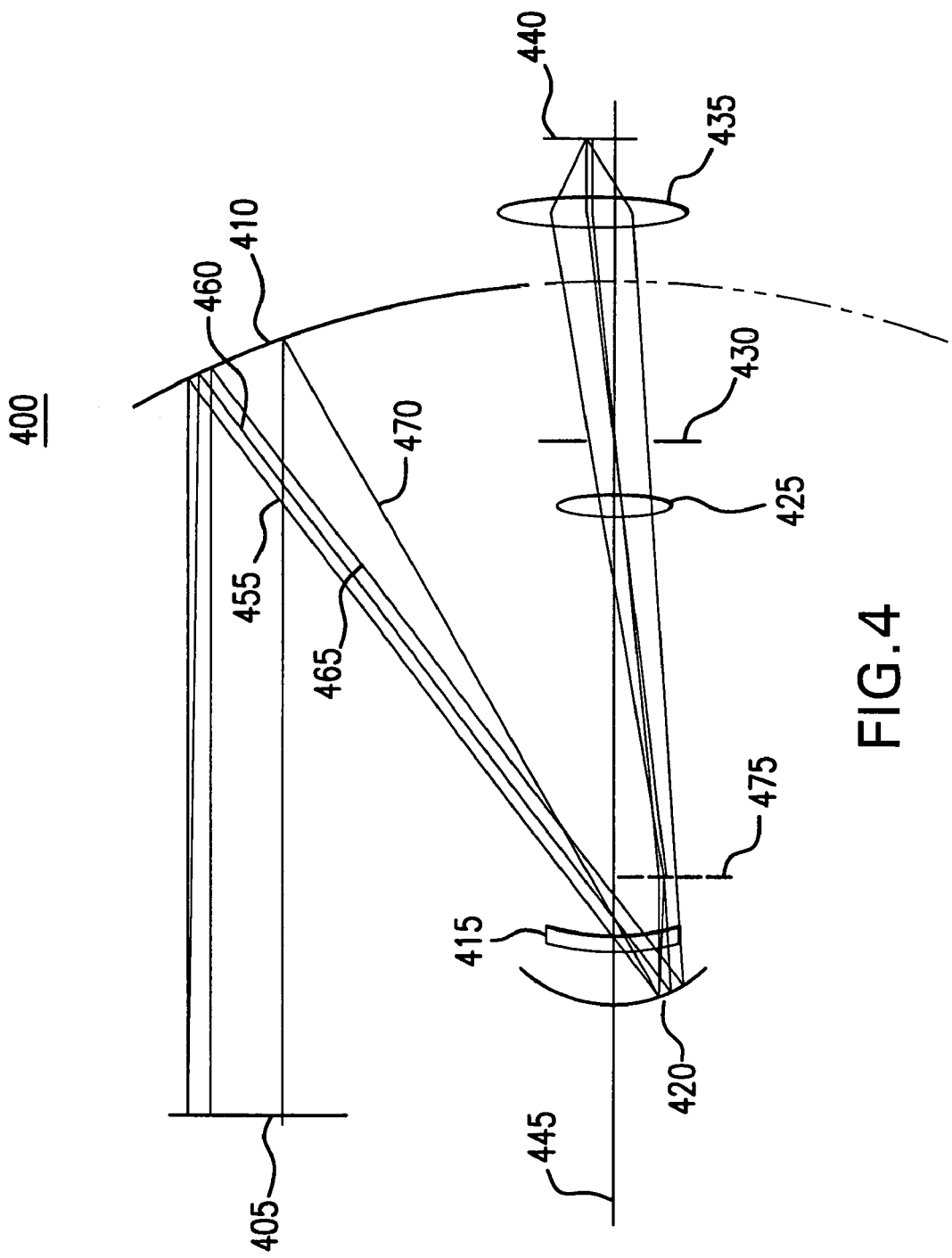
FIG. 4 is a diagram of a projection system with an off-axis mirror segment for use in a lithography tool, according to an embodiment of the present invention.

FIG. 4 is a diagram of projection system 400 with an off-axis mirror segment for use in a lithography tool, such as lithographic projection apparatus 100, according to an embodiment of the invention. Projection system 400 provides similar functionality to projection system 200, but allows for greater flexibility in the placement of a substrate to be imaged. Projection system 400 also provides for greater field curvature correction and reduction of chromatic aberrations than either projection system 200 or 300.

Projection system 400 includes pattern generator 405, off-axis mirror segment 410, negative refractive lens group 415, fold mirror 420, relay 425, aperture stop 430, and refractive lens group 435. Pattern generator 405 modulates light for use in forming an image on a wafer or other substrate. Pattern generator 405 can be a spatial light modulator (SLM), but is not limited to an SLM. Light rays, such as rays 455, 460, 465 and 470 are transmitted from pattern generating device 405 to off-axis mirror segment 410. Rays 455 and 465 are marginal rays, while rays 460 and 470 are chief rays. Line 445 represents the optical axis of projection system 400.

Off-axis mirror segment 410 receives light rays and reflects those light rays. Off-axis mirror segment 410 can be concave, which is conducive for field curvature correction. Light rays 455, 460, 465 and 470 are reflected from off-axis mirror segment 410 to negative refractive lens group 415. Negative refractive lens group 415 can include one or more refractive lens elements. In an embodiment negative refractive lens group 415 includes negative refractive lens elements. Negative refractive lens group 415 can be used to correct chromatic aberrations in the modulated light, thereby simplifying other lens groups within projection system 400. Upon passing through negative refractive lens group 415, the modulated light reflects off of concave mirror 420. Concave mirror 420 provides further field curvature correction. Concave mirror 420 is positioned close to negative refractive lens group 415.

In an embodiment, concave mirror 420 is positioned as close as possible to refractive lens group 415. Concave mirror 420 reflects the modulated light back through negative refractive lens group 415. An intermediate image 475 is formed after the modulated light passes through negative refractive lens group 415.

The modulated light is then transmitted through relay 425. Relay 425 includes a set of refractive lens and mirrors as will be known by individuals skilled in the relevant arts. Relay 425 provides optical power for projection system 400 and passes the light rays through aperture stop 430. Upon passing through aperture stop 430, light rays 455, 460, 465 and 470 impinge upon refractive lens group 435. Upon receiving light rays, refractive lens group 435 provides additional optical power for projection system 400 and focuses the light rays onto substrate 440 to form an image on substrate 440. Refractive lens group 435 can be a single refractive element or a set of refractive elements. Aperture stop 430 should be placed at the front focal point of refractive lens group 435.

Figure 5:
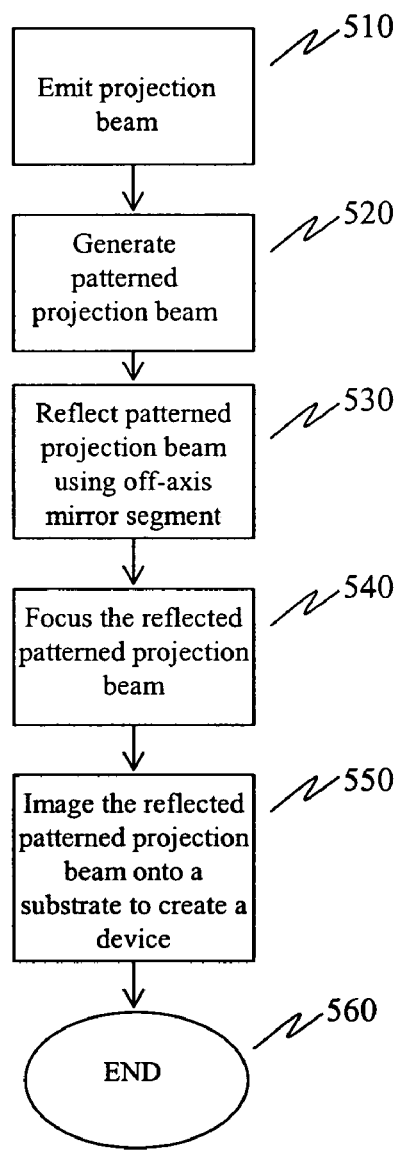
FIG. 5 is a flowchart of a method to produce a device using a lithographic apparatus including a projection system with an off axis mirror segment, according to an embodiment of the invention

FIG. 5 is a flowchart of method 500 to produce a device using a lithographic apparatus including a projection system with an off axis mirror segment, according to an embodiment of the invention. Method 500 begins in step 510. In step 510, a projection beam is emitted. For example, radiation system 102 can be used to emit a projection beam. In step 520, a patterned projection beam is generated based on the projection beam emitted is step 510. For example, pattern generator 104 can be used to apply a pattern to the emitted projection beam. In step 530, the patterned projection beam is reflected using an off-axis mirror segment, such as for example, off-axis mirror segment 220. In step 540, the reflected patterned projection beam generated in step 530 is focused. Focusing can occur through the use of a combination of reflective and refractive elements as will be known by individuals skilled in the relevant arts, based on the teachings herein. In step 550, a device is created by imaging the reflected patterned projection beam onto a substrate, as will be known by individuals skilled in the art, based on the teachings herein. Example devices can include, but are not limited to, integrated circuits and flat panel displays. In step 560, method 500 ends.

In general, the invention has several advantages, including but not limited to the following. The use of an off-axis mirror segment as the first element receiving light from a pattern generating device, such as a spatial light modulator, for example, enhances the robustness of the system. Specifically, inhomogeneities in the off-axis mirror do not affect system performance. Furthermore, wedge errors that typically degrade performance in other systems are not relevant and do not impact system performance. As a result, an off-axis mirror segment that is larger in size than typical first elements in a projection optical system can be used, and therefore the total spatial light modulator area can be increased. Moreover, the use of concave mirrors are conducive for the correction of field curvature, which in turn can simplify the refractive portions of the optical system.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A projection system having multiple mirror segments for use in a lithography tool for processing modulated light used to form an image on a substrate, comprising:
   an off-axis mirror segment that receives modulated light, wherein an axis of the off-axis mirror segment differs from an axis of the substrate, wherein the off-axis mirror segment is the first mirror segment within the projection system;
   an aperture stop that receives the modulated light from said off-axis mirror segment; and
   a refractive lens group that focuses the modulated light onto the substrate;
   wherein the projection system is configured such that an intermediate real image is not formed between the off-axis mirror segment and the refractive lens group.

2. The projection system of claim 1, further comprising a pattern generating device that provides the modulated light for use in forming the image on the substrate.

3. The projection system of claim 2, wherein said pattern generating device is a spatial light modulator.

4. The projection system of claim 1, wherein said off-axis mirror segment is concave.

5. The projection system of claim 1, wherein said off-axis mirror segment provides field curvature correction.

6. The projection system of claim 1, wherein said substrate is a semiconductor wafer or flat panel display.

* * * * *

UNITED STATES PATENT AND TRADEMARK OFFICE
CERTIFICATE OF CORRECTION

PATENT NO. : 7,511,798 B2
APPLICATION NO. : 10/902469
DATED : March 31, 2009
INVENTOR(S) : Stanislav Smirnov Page 1 of 1

It is certified that error appears in the above-identified patent and that said Letters Patent is hereby corrected as shown below:

In column 4, line 35, "An pattern generator" should be --A pattern generator--.

Signed and Sealed this

Ninth Day of June, 2009

JOHN DOLL
*Acting Director of the United States Patent and Trademark Office*